(12) United States Patent
Glas et al.

(10) Patent No.: US 9,601,920 B2
(45) Date of Patent: Mar. 21, 2017

(54) TRANSIENT VOLTAGE PROTECTION CIRCUITS AND DEVICES

(71) Applicant: Infineon Technologies AG, Neubiberg (DE)

(72) Inventors: Alexander Glas, Munich (DE); Klaus Scharnagl, Schliersee (DE)

(73) Assignee: Infineon Technologies AG, Neubiberg (DE)

( * ) Notice: Subject to any disclaimer, the term of this patent is extended or adjusted under 35 U.S.C. 154(b) by 169 days.

(21) Appl. No.: 14/328,573

(22) Filed: Jul. 10, 2014

(65) Prior Publication Data

US 2016/0013638 A1    Jan. 14, 2016

(51) Int. Cl.
*H02H 9/04* (2006.01)
*H01L 27/02* (2006.01)

(52) U.S. Cl.
CPC .......... *H02H 9/04* (2013.01); *H01L 27/0248* (2013.01); *H01L 27/0255* (2013.01); *H02H 9/046* (2013.01)

(58) Field of Classification Search
CPC ....................................................... H02H 9/04
USPC ......................................................... 361/56
See application file for complete search history.

(56) References Cited

U.S. PATENT DOCUMENTS

| | | | |
|---|---|---|---|
| 6,867,461 B1 | 3/2005 | Ker et al. | |
| 8,254,071 B2 | 8/2012 | Dunnihoo et al. | |
| 2004/0012052 A1* | 1/2004 | Kawamoto | H01L 27/0255 257/362 |
| 2007/0120193 A1* | 5/2007 | Inoue | H01L 27/0255 257/358 |
| 2011/0194220 A1* | 8/2011 | Duvvury | H01L 23/60 361/58 |
| 2012/0306060 A1 | 12/2012 | Schmenn et al. | |

* cited by examiner

*Primary Examiner* — Thienvu Tran
*Assistant Examiner* — Kevin J Comber
(74) *Attorney, Agent, or Firm* — Slater Matsil, LLP (57) ABSTRACT

According to an embodiment, a transient voltage protection circuit includes a first integrated circuit including an input node, an output node, a first transient voltage protection component coupled between the input node and a reference voltage node, and an impedance element coupled between the input node and the output node. The first transient voltage protection component has a first dynamic resistance and the output node is configured to be coupled to an electrostatic discharge (ESD) protection component having a second dynamic resistance that is greater than the first dynamic resistance.

26 Claims, 5 Drawing Sheets

TRANSIENT VOLTAGE PROTECTION CIRCUITS AND DEVICES

TECHNICAL FIELD

The present invention relates generally to electronic circuits and devices, and, in particular embodiments, to transient voltage protection circuits and devices.

BACKGROUND

Semiconductor devices are manufactured by depositing many different types of material layers over a semiconductor workpiece, wafer, or substrate, and patterning the various material layers using lithography. The material layers typically comprise thin films of conductive, semiconductive, and insulating materials that are patterned, etched, or altered to form integrated circuits (ICs). There may be a plurality of transistors, memory devices, switches, conductive lines, diodes, capacitors, logic circuits, and other electronic components formed on a single die or chip, for example.

Many ICs include electrostatic discharge (ESD) protection circuits designed to protect the ICs against transient voltages such as ESD events and surges. An ESD protection circuit typically is designed to turn on during an ESD event and form a current discharge path to shunt the large ESD current and clamp the voltage of input/output (I/O) and supply pads to a sufficiently low level to prevent the IC from being damaged. The current shunting path is often provided by an active device that provides a conduction path with a relatively low on-resistance, for example. The ESD protection circuit typically ensures a low resistance path to prevent voltages from building up to potentially damaging levels.

ESD protection circuits may include elements such as diodes, resistors, thyristors, transistors, and/or capacitors, as examples. Some ESD protection circuits may include a trigger circuit, a buffer circuit, and/or a clamping circuit, as examples.

However, area on integrated circuits (ICs) is often limited. Further, as some devices on ICs, such as logic circuitry, memory, and other circuitry are scaled to smaller geometries, the size of ESD protection circuits may not necessarily decrease in size. ESD protection circuits may occupy a large percentage of the surface area of a die and may limit further reduction in size of an IC and increase cost.

Further, as operational frequencies increase, parasitic capacitances on input and output connections become more significant. Thus, improved ESD protection circuits are needed which occupy small IC areas and include minimal parasitic capacitances.

SUMMARY OF THE INVENTION

According to an embodiment, a transient voltage protection circuit includes a first integrated circuit including an input node, an output node, a first transient voltage protection component coupled between the input node and a reference voltage node, and an impedance element coupled between the input node and the output node. The first transient voltage protection component has a first dynamic resistance and the output node is configured to be coupled to an electrostatic discharge (ESD) protection component having a second dynamic resistance that is greater than the first dynamic resistance.

In another embodiment, a method of protecting a circuit from a transient voltage includes providing a transient voltage protection circuit with an input node and an output node, receiving a transient peak current at the input node, conducting a major portion of the transient peak current to ground through a transient protection diode coupled to the input node, and conducting a minor portion of the transient peak current through a resistive element coupled between the input node and the output node. The output node is configured to be coupled to a device under protection (DUP) having a further transient voltage protection circuit. A dynamic resistance of the transient protection diode is less than a dynamic resistance of the further transient voltage protection circuit.

According to a further embodiment, a semiconductor device includes a substrate, a first electrostatic discharge (ESD) diode formed in the substrate, an insulating layer formed at a top surface of the substrate, a first contact layer formed at a top surface of the insulating layer, a first conductive layer formed in the insulating layer and coupling the first contact layer to the first ESD diode, a resistive layer formed in the insulating layer immediately adjacent to the first conductive layer, a second contact layer formed at the top surface of the insulating layer, and a second conductive layer formed in the insulating layer and coupling the second contact layer to the resistive layer. The first ESD diode includes a discharge path to a ground connection with a first dynamic resistance and the second contact layer is configured to be coupled to a second ESD diode with a second dynamic resistance greater than the first dynamic resistance.

In a still further embodiment, a method of protecting a circuit from a transient voltage includes receiving a transient peak current at a transient voltage protection circuit coupled between an input node and an output node, generating a first voltage drop across a transient voltage protection diode based on the received transient peak current, and generating a second voltage drop across a resistive element based on the received transient peak current. The resistive element is coupled between the input node and the output node and the output node is configured to be coupled to a device under protection (DUP) having a secondary transient voltage protection diode. A dynamic resistance of the transient voltage protection diode is less than a dynamic resistance of the secondary transient voltage protection diode.

According to yet another embodiment, a semiconductor device includes a first contact pad disposed over a semiconductor substrate, a first transient voltage protection device including a first dynamic resistance, a resistive layer disposed in or over the semiconductor substrate, and a second contact pad disposed over the semiconductor substrate. The first transient voltage protection device is disposed in or over a semiconductor substrate. The first transient voltage protection device is coupled to the first contact pad and the resistive layer is coupled to the second contact pad. The second contact pad is configured to be coupled to a second transient voltage protection device having a second dynamic resistance greater than the first dynamic resistance.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely integrated circuits (ICs), and more particularly, transient voltage, including electrostatic discharge (ESD) and surge event, protection devices and circuits. Some of the various embodiments described herein include ESD protection components, transient voltage suppression (TVS) diodes, and single stage ESD protection devices. In other embodiments, aspects may also be applied to other applications involving any type of ESD circuit according to any fashion as known in the art. Further, the terms transient voltage, ESD, and surge, are used repeatedly herein to describe generic voltage transients or specific known types of voltage transients. It should be understood that embodiment protection circuits described herein may be applied to protecting components or devices from any type of voltage transient including ESD events and surge events as defined in numerous standards and understood by those of skill in the art. Thus, description in reference to a specific voltage transient, such as an ESD event or a surge event, may also be applied to any other voltage transients.

According to various embodiments, a single stage ESD protection circuit is disclosed which maintains high performance and includes low parasitic capacitance and decreased area. In the semiconductor industry, the feature size or dimension is continually decreasing. As a result of the feature size shrinking with each new technology node, the ESD sensitivity of semiconductor circuits is simultaneously increasing. According to various embodiments, efficient ESD protection circuits are disclosed herein that address the increasing sensitivity of semiconductor circuits while reducing detrimental effects on signal integrity (SI). According to some examples, such single stage ESD protection circuits are especially useful for high-speed signal lines, audio output stages, low noise amplifiers, or other highly ESD sensitive signal lines, for example. According to various embodiments described herein in reference to the figures, numerous advantages will be apparent to one of skill in the art. The ESD protection circuits described herein may be applied to any type of voltage transient protection, such as surge event protection, for example.

Figure 1A:
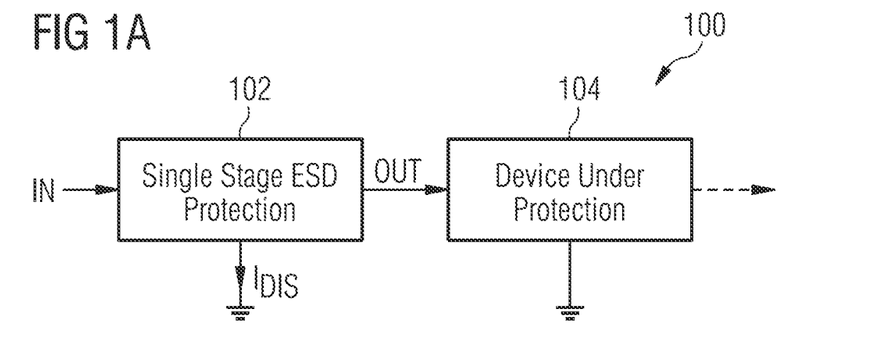
FIG. 1a illustrates a system block diagram of an embodiment ESD protection system.

FIG. 1a illustrates a system block diagram of an embodiment ESD protection system 100 including a single stage ESD protection circuit 102 and a device under protection (DUP) 104. According to various embodiments, each ESD stage provides a path to ground through a discharge or surge device. Thus, single stage ESD protection circuit 102 provides a single current path to ground through a single discharge or surge device, such as a transient voltage suppression (TVS) diode. In various embodiments, input signals intended for DUP 104 first pass through single stage ESD protection circuit 102. For this reason, during normal operation, it is advantageous that an ESD protection circuit introduces minimal impedance, including resistance and parasitic capacitance, compared to an ESD circuit having more than one stage. Thus, single stage ESD protection circuit 102 includes a minimal impedance. During a transient voltage event, such as an ESD or surge event, when an ESD or a surge current is received at an input node IN, single stage ESD protection circuit 102 clamps the voltage at output node OUT to a lower voltage by diverting a major portion $I_{DIS}$ of the ESD current to ground.

In various embodiments, DUP 104 may be any circuit being protected from ESD or surge events and may include some additional ESD protection. For example, DUP 104 includes an ESD circuit capable of protecting DUP 104 from small magnitude ESD events at node OUT (such as before single stage ESD protection circuit 102 is coupled to node OUT). Such smaller events may include human body model (HBM) level ESD events defined by the ANSI/ESDA/JEDEC JS-001 standard, for example. In comparison, single stage ESD protection circuit 102 may be capable of protecting DUP 104 from large magnitude ESD events, such as system level ESD events defined by, e.g., the IEC 61000-4-2 standard.

In some embodiments, the ESD protection circuit is also capable of protecting DUP 104 from larger surge events defined by the IEC61000-4-5 standard. As is described further herein below, ESD protection system 100 may include numerous components with numerous protected nodes and numerous ICs with numerous input or output pins.

Figure 1B:
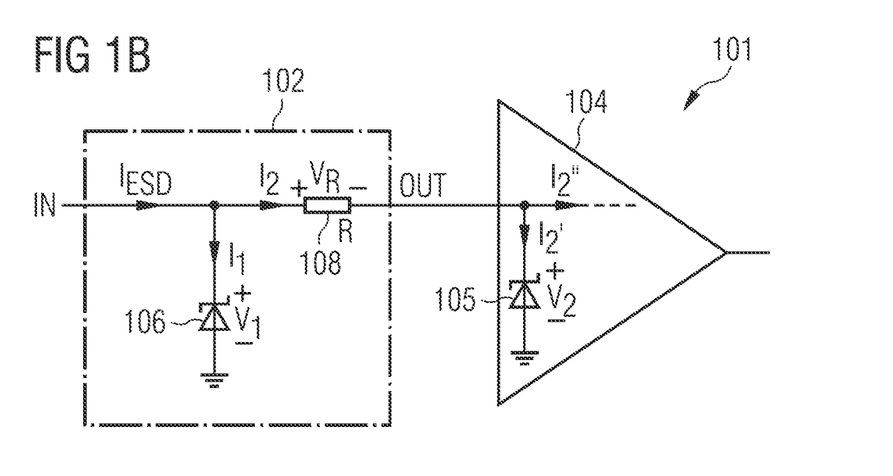
FIG. 1b illustrates a schematic diagram of an embodiment ESD protection system.

FIG. 1b illustrates a schematic diagram of an embodiment ESD protection system 101 that is an implementation of ESD protection system 100 shown in FIG. 1a. According to various embodiments, ESD protection system 101 includes ESD diode 106, resistor 108, and DUP 104. In such embodiments, ESD protection circuit 102 as described in FIG. 1a is implemented as ESD diode 106 and resistor 108. During normal operation, input signals on input node IN pass through resistor 108 to DUP 104. During an ESD event, an ESD current $I_{ESD}$ is injected into input node IN. A first current $I_1$, which is the major portion of ESD current $I_{ESD}$, is conducted to ground through ESD diode 106. The remainder of ESD current $I_{ESD}$ is conducted through resistor 108 to DUP 104 as a second current $I_2$. The majority of the second current $I_2$ is conducted to ground through second ESD diode 105 included in DUP 104.

In various embodiments, ESD diode 106 is any type of transient voltage suppression (TVS) diode. As discussed above, ESD diode 106 is capable of conducting a large system level ESD current to ground. For example, ESD diode 106 may be capable of discharging a 20 kV surge to ground. In other embodiments, ESD diode 106 is capable of discharging an 8 kV surge to ground. Further, the second ESD diode 105 is capable of conducting smaller HBM level ESD currents to ground. ESD diode 106 may be a discrete or external high level ESD protection component on a separate IC while ESD diode 105 is a semiconductor component integrated in DUP 104, which may be on a single IC. As a portion of DUP 104, ESD diode 105 may only be capable of protecting DUP 104 from HBM level ESD events. Thus, ESD diode 106 may be a stronger or more robust ESD component designed to withstand and dissipate transient voltages as high as 15 or 30 kV while ESD diode 105 may be a less robust ESD component designed as a portion of DUP 104 to withstand and dissipate HBM level transient voltages of about 2 kV. In some embodiments, ESD diode 105 may be able withstand transient voltages ranging from 2 kV up to 10 kV. In other embodiments, each ESD component may dissipate higher or lower transient voltages. In various embodiments, the dynamic on resistance $R_{dyn}$ of ESD diode 105 is larger than the on resistance of ESD diode 106. In a specific embodiment, the dynamic on resistance $R_{dyn}$ of ESD diode 106 is between 100 and 500 mΩ while the dynamic on resistance $R_{dyn}$ of ESD diode 105 is between 1 and 5Ω. In another specific example, the dynamic on resistance $R_{dyn}$ of ESD diode 106 may range as high as 1.5Ω while the dynamic on resistance $R_{dyn}$ of ESD diode 105 is greater than 1.5 and less than 5Ω. Alternatively, the dynamic on resistance $R_{dyn}$ for ESD diodes 105 and 106 may be outside these ranges.

In some embodiments, DUP 104 may also conduct a small current into the device. In such cases, the second current $I_2$ is split as $I_2=I_2'+I_2''$, where $I_2'$ is the current through ESD diode 105 and $I_2''$ is the current into DUP 104. In some embodiments, current $I_2''$ is negligible and can be ignored if ESD diodes 106 and 105 are functional. In various embodiments, ESD protection circuit 102 is implemented as an IC.

Accordingly, during a transient voltage event, such as an ESD or surge event, the transient current $I_{ESD}$ is distributed between the ESD diode 106 and second ESD diode 105 as follows, $I_{ESD}=I_1+I_2$. Resistor 108 provides a voltage drop $V_R=I_2 \cdot R$ from input node IN to output node OUT coupled to DUP 104. Voltage drop $V_R$ protects DUP 104 from damage when the clamping voltage, which is equal to the voltage drop $V_1$ across ESD diode 106 during an ESD event, is greater than a voltage at which DUP 104 would be damaged. The voltages depicted in FIG. 1b follow the equation, $V_1=V_R+V_2$, indicating that voltage drop $V_2$ is less than voltage drop $V_1$ by a difference of $V_R$. Thus, DUP 104 is protected from the full voltage drop $V_1$ by the voltage drop $V_R$. In various embodiments, the trigger voltages at which ESD diode 106 and ESD diode 105 conduct a transient voltage are about equal. In other embodiments, the trigger voltages are within 2 volt.

In various embodiments, resistor 108 has a resistance value of R, which may be less than 10Ω. In some embodiments, resistance value R may be less than 2Ω. In the various embodiments, resistance value R may be larger than 0.1Ω in order to ensure a voltage drop $V_R$ sufficient to protect DUP 104. In embodiments including high-speed signals, i.e., signals with high frequencies above 1 GHz, resistance value R may be between 1 and 3Ω.

According to further embodiments, the ratio $I_1:I_2$ may be used to define the relationship between discharge current capacities of ESD diode 106 and second ESD diode 105. For example, in one embodiment, during a surge or an ESD event, the ratio of first current $I_1$ to second current $I_2$ ($I_1:I_2$) is at least 3:1 and may be between about 5:1 and 100:1. Similarly, the maximum current each diode can withstand before failure, including damage or destruction, may follow a ratio $I_1\_MAX:I_2'\_MAX$. For example, in an embodiment, the ratio of maximum currents before damage or destruction for ESD diode 106 to second ESD diode 105 ($I_1\_MAX:I_2'\_MAX$) is at least 3:1 and between about 5:1 and 40:1. For example, $I_1\_MAX$ may be 30-60 A and $I_2'\_MAX$ may be 1.5 A in some embodiments. An ESD current of about 1.5 A may be the result of a 2 kV ESD event and an ESD current of about 30 A may be the result of a 15 kV ESD event.

In other embodiments, the ratio $V_1:V_2$ may be used to define the relationship between clamping voltages of ESD diode 106 and second ESD diode 105. For example, in some embodiments, during a surge event, the ratio of the clamping voltage $V_1$ across ESD diode 106 to the clamping voltage $V_2$ across second ESD diode 105 is at least 1.1:1 and may be between about 1.1:1 and 5:1. In other embodiments, the ratio $V_1:V_2$ may be as high as 20:1.

Figure 2A:
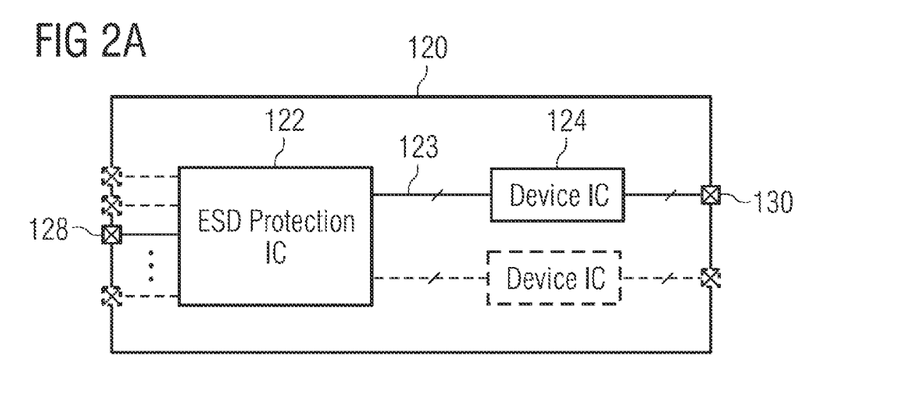
FIGS. 2a and 2b illustrate diagrams of embodiment ESD protection systems including a circuit board and an ESD protection integrated circuit.

FIG. 2a illustrates a diagram of a circuit board 120 with embodiment integrated circuits including ESD protection IC 122 and device IC 124. According to various embodiments, circuit board 120 is a printed circuit board (PCB). ESD protection IC 122 is coupled to input pin 128. Input pin 128 may be coupled to other components on circuit board 120 or may be coupled to external components. Further, ESD protection IC 122 may be coupled to multiple pins and receive multiple input signals as shown.

In various embodiments, ESD protection IC 122 may be coupled to multiple device ICs in addition to device IC 124, each IC forming a device under protection (DUP). The various device ICs may be any type of component, such as amplifiers or low noise amplifiers, for example. ESD protection IC 122 may be coupled to device IC 124 through multiple protected pins or a single protected pin as shown by bus line 123. ESD protection IC 122 may include an array of multiple protection devices coupled to multiple pins on device IC 124 in order to provide ESD protection to each of the multiple pins. For example, device IC 124 may include an HDMI link and ESD protection IC 122 may be coupled to each HDMI high-speed input/output (I/O) port. In various embodiments, device IC 124 may be further coupled to another component through output pin 130. The other components coupled to output pin 130 may be mounted on circuit board 120 or externally connected to circuit board 120. Further, additional device ICs may also be coupled to multiple components through additional output pins, as shown.

Figure 2B:
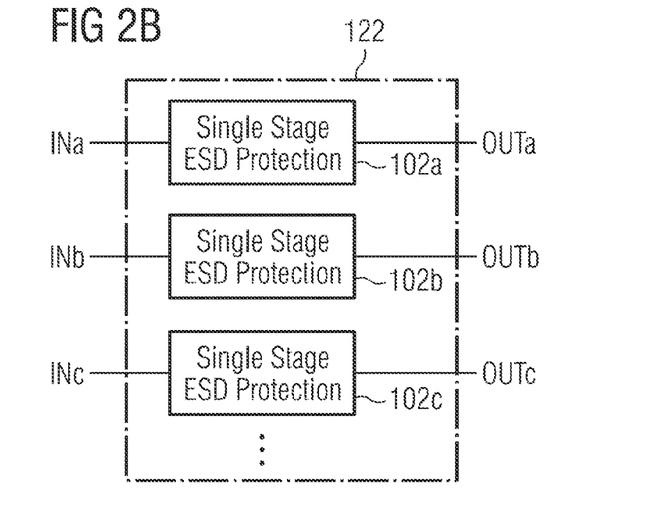

FIG. 2b illustrates a system block diagram of an embodiment ESD protection IC 122 as described in reference to FIG. 2a. According to various embodiments, ESD protection IC 122 includes an array of single stage ESD protection circuits 102a-n (shown are circuits 102a, 102b, and 102c, for illustration purposes). Each single stage ESD protection circuit may include various protection elements, such as diodes or resistors, as described herein in reference to the other figures. Further, each of single stage ESD protection circuits 102a-102n is coupled between an input node INa-INn and an output node OUTa-OUTn. In such embodiments, input signals are received on input nodes INa-INn and passed to output nodes OUTa-OUTn, respectively. In some embodiments, single stage ESD protection circuits 102a-102n may be coupled between multiple input nodes and multiple output nodes. During an ESD event, the ESD current is injected into one or more of input nodes INa-INn while the output nodes OUTa-OUTn are protected from large ESD signals. The output nodes OUTa-OUTn may receive some amount of ESD current after a single stage ESD protection circuit conducts the majority to ground, as described herein in reference to the other figures.

Figure 3:
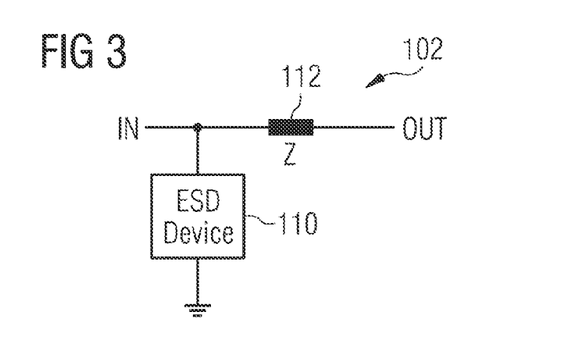
FIG. 3 illustrates a schematic diagram of an embodiment ESD protection circuit.

FIG. 3 illustrates a schematic diagram of an embodiment ESD protection circuit 102 including an ESD device 110 and an impedance element 112. According to various embodiments, ESD currents are injected at input node IN during ESD events. ESD device 110 diverts a majority of the current to ground by forming a conduction path to ground during an ESD event. Impedance element 112 conducts a second current from input node IN to output node OUT during an ESD event.

According to various embodiments, ESD protection circuit 102 may be implemented as described in reference to FIG. 1b herein above. Impedance element 112 may be a resistor in some embodiments. The impedance value Z of impedance element 112 affects the performance of ESD protection circuit 102. For example, a larger impedance value Z may increase the ESD protection during ESD events while decreasing the signal integrity (SI) of input signals during normal operation. Thus, impedance value Z may be less than or equal to 10Ω in some embodiments, or less than 3Ω in other embodiments. In various embodiments the impedance value is above 0.1Ω in order to provide a significant voltage drop across impedance element 112. Impedance value Z may also include values that are not purely resistive, but also include a reactance portion.

Figure 4A:
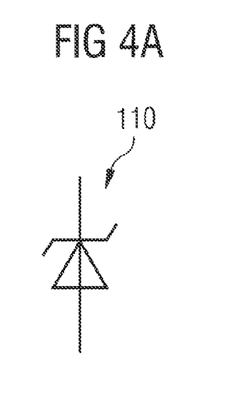
FIGS. 4a, 4b, 4c, and 4d illustrate schematics of various embodiment ESD devices.
Figure 4B:
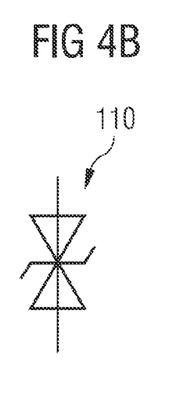
Figure 4C:
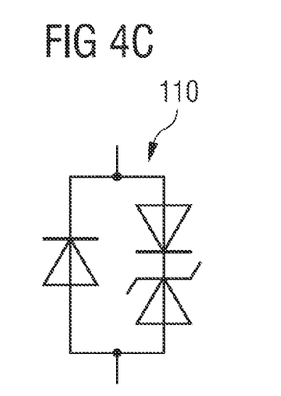
Figure 4D:
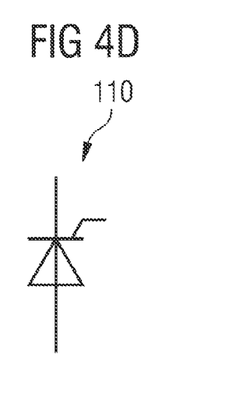

FIGS. 4a, 4b, 4c, and 4d illustrate schematics of various embodiment ESD devices 110 as described in reference to FIG. 3. According to various embodiments, any of the ESD devices shown in FIG. 4a, 4b, 4c, or 4d may be included in ESD protection circuit 102. ESD device 110 may include a Zener diode, such as a TVS diode, as shown in FIG. 4a, ESD device 110 may include series connected opposing Zener diodes as shown in FIG. 4b, ESD device 110 may include a parallel diode structure as shown in FIG. 4c, or ESD device 110 may include a thyristor as shown in FIG. 4d. The parallel structure shown in FIG. 4c may include a first diode with a first orientation coupled in parallel with a second diode with a second orientation, opposite the first orientation. The second diode may also be coupled with a series connected opposing Zener diode. In various embodiments, the various ESD devices 110 may include bi-directional structures of two ESD devices each, with one ESD device coupled in each direction. In alternative embodiments, further combinations are also envisioned. The various blocking diodes may also be formed as 2 terminal or 3 terminal thyristors in various embodiments. In other embodiments, MOS transistors may be used as fast switching ESD devices in place of the blocking diodes described herein.

Figure 5:
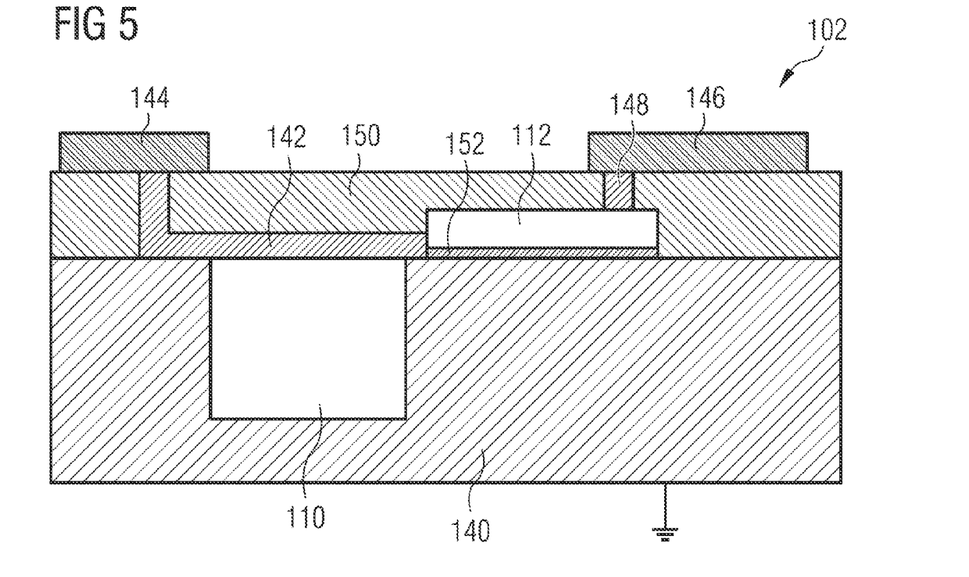
FIG. 5 illustrates a cross section of an embodiment protection circuit.

FIG. 5 illustrates a cross section of an embodiment ESD protection circuit 102 as described herein in reference to the other figures. According to various embodiments, an ESD device 110 is formed in semiconductor substrate 140 which has a body contact to ground or another reference terminal. ESD device 110 may be implemented as any of the diodes or other devices as described herein. In various embodiments, an insulating layer 150 is formed on a top surface of semiconductor substrate 140. A conductive layer 142 is formed in insulating layer 150. Conductive layer 142 electrically couples ESD diode 110 to input contact 144. Conductive layer 142 also couples input contact 144 to resistive layer 112, which is formed on oxide 152 that is formed on the top surface of semiconductor substrate 140. Conductive layer 148 is formed in insulating layer 150 and couples resistive layer 112 to output contact 146.

According to various embodiments, semiconductor substrate 140 is a silicon substrate and ESD device 110 is a TVS diode. Conductive layers 142 and 148 may be formed of a metal, silicide, or doped semiconductor material, for example. Insulating layer 150 may be formed of an oxide or a polymer, for example. Oxide 152 may be any insulating material or oxide. Resistive layer 112 may be doped polysilicon, undoped polysilicon, or another semiconductor material in various embodiments. Alternatively, resistive layer 112 may be formed of a metal, metal alloy, or metallic compound, such as TiN, Al, AlCu, or others. Contact layers 144 and 146 may be formed as metallization levels or as silicides. Various modifications and other materials may be included that fulfill similar functions as is known in the art.

In various embodiments, resistive layer 112 is formed with a specific resistance value. The width, thickness, and length of resistive layer 112 along with the type of contacts to conductive layers 142 and 148 affect the overall resistance of resistive layer 112. Thus, in different embodiments, these parameters may have any values in order to set the resistive value as described herein.

In various embodiments, the resistive layer 112 may be formed within or over the semiconductor substrate 140. For illustration, the resistive layer 112 is formed over the semiconductor substrate 140. For example, in an alternative embodiment, the resistive layer 112 may be formed within a trench as a buried polysilicon line or metal line.

Figure 6:
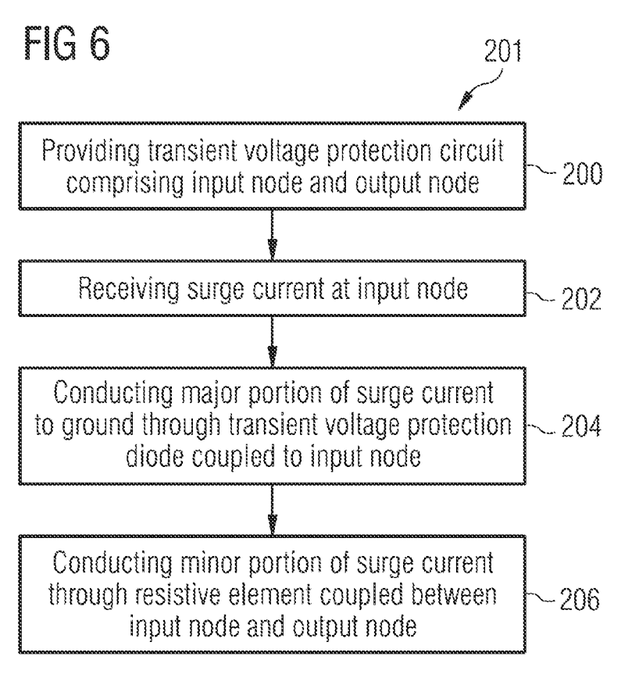
FIG. 6 illustrates a system block diagram of an embodiment method of operation.

FIG. 6 illustrates a system block diagram of an embodiment method of operation 201 including steps 200, 202, 204, and 206. According to various embodiments, method of operation 201 is a method of protecting a circuit from ESD. Step 200 includes providing a transient voltage protection circuit with an input node and an output node. Step 202 includes receiving a surge current or a transient peak current at the input node. The surge current, which includes any type of transient current spike, may be a system level ESD current, an HBM level ESD current, or a surge current as defined, e.g., by the IEC 61000-4-5 standard in some embodiments. The surge current is injected into the input node from an input pin or contact pad in various embodiments. Step 204 includes conducting a major portion of the surge current to a ground node through a surge diode coupled to the input node. The surge diode may be implemented as a TVS diode as described above in reference to FIGS. 1-5. Further, step 206 includes conducting a minor portion of the surge current through a resistive element coupled between the input node and an output node. The output node may be coupled to a device under protection (DUP) having a further ESD circuit. In such embodiments, the dynamic on resistance of the transient voltage diode is less than a dynamic on resistance of the further ESD circuit.

Figure 7:
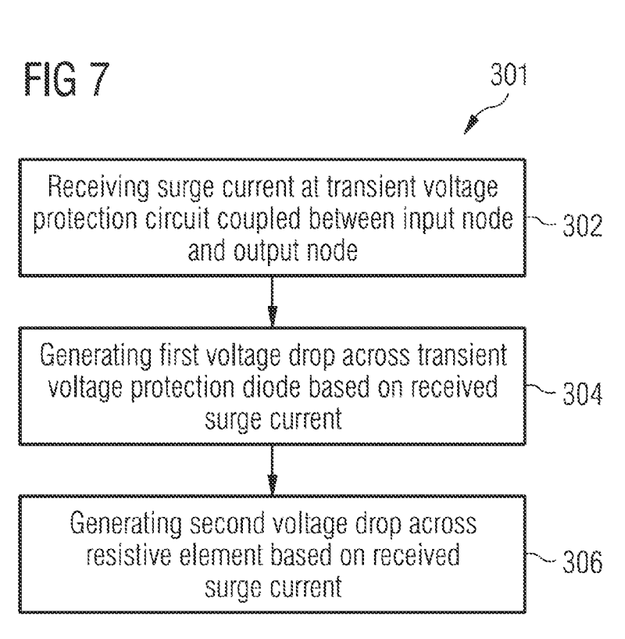
FIG. 7 illustrates a system block diagram of another embodiment method of operation.

FIG. 7 illustrates a system block diagram of another embodiment method of operation 300 including steps 302, 304, and 306. According to various embodiments, method of operation 300 is a method of protecting a circuit from an electrical surge, such as an ESD, for example. Step 302 includes receiving a surge current, ESD current, or other transient current peak at a transient voltage protection circuit coupled between an input node and an output node. The transient voltage protection circuit may include a transient voltage protection diode and a resistive element as described in various embodiments described previously. In other embodiments, the transient voltage protection diode may be any type of single stage surge or ESD protection circuit. Step 304 includes generating a first voltage drop across the transient voltage protection diode based on the received surge or ESD current and step 306 includes generating a second voltage drop across a resistive element based on the received surge or ESD current. The resistive element is coupled between the input node and the output node. In various embodiments, the output node is coupled to a DUP with a secondary ESD protection diode. In such embodiments, the dynamic on resistance of the transient voltage protection diode may be less than the dynamic on resistance of the secondary ESD diode. The secondary ESD diode may include any type of surge or ESD protection device and is included within the DUP IC.

Figure 8A:
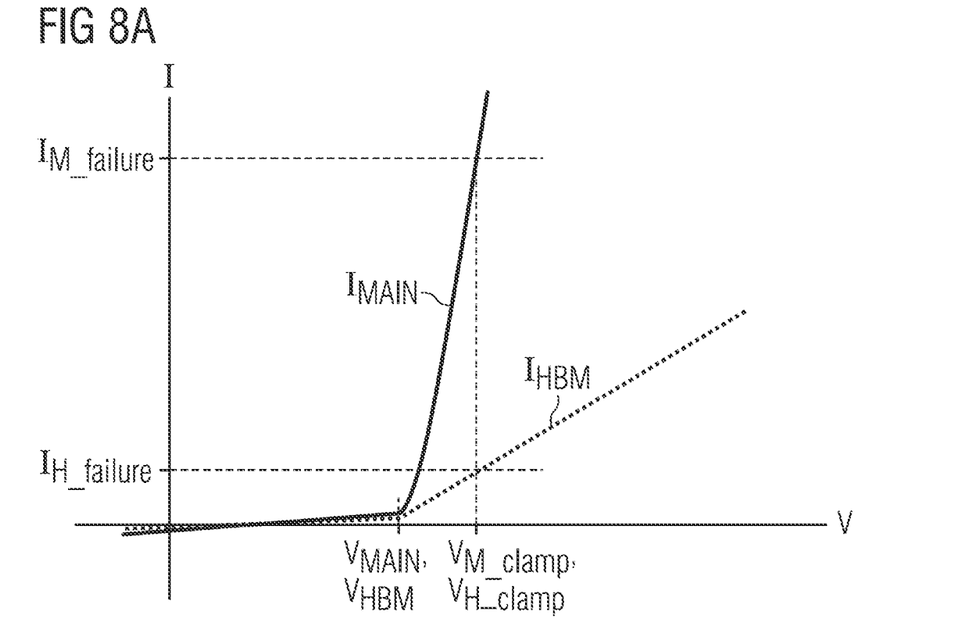
FIGS. 8a and 8b illustrate I-V plots of embodiment ESD protection components.

FIG. 8a illustrates I-V plots of embodiment ESD protection components, such as described above in reference to FIGS. 1a and 1b. According to various embodiments, a single stage ESD protection circuit includes a main ESD component or stage, such as ESD diode 106, with the solid I-V curve showing current $I_{MAIN}$ through the main ESD component and a device under protection (DUP) includes an HBM level ESD component, such as second ESD diode 105, with the dotted I-V curve showing current $I_{HBM}$ through the HBM level ESD component integrated in the DUP. In various embodiments, the main ESD component conducts main current $I_{MAIN}$ with trigger voltage $V_{MAIN}$ and clamping voltage $V_{M\_clamp}$. Similarly, the DUP ESD component conducts secondary current $I_{HBM}$ with trigger voltage $V_{HBM}$ and clamping voltage $V_{H\_clamp}$. In some embodiments, trigger voltage $V_{MAIN}$ of the main ESD component is as close as possible to trigger voltage $V_{HBM}$ of the DUP ESD component. In alternative embodiments, trigger voltage $V_{MAIN}$ may be different from trigger voltage $V_{HBM}$. In some embodiments, the main ESD component has trigger voltage $V_{MAIN}$ within 1 volt of trigger voltage $V_{HBM}$ of the DUP ESD component. In alternative embodiments, the main ESD component has trigger voltage $V_{MAIN}$ that is more than 1 volt different from trigger voltage $V_{HBM}$ of the DUP ESD component.

In some embodiments, when the main ESD component and the HBM level ESD component are in parallel without any serial resistance between the two components, $V_{M\_clamp}$ may be identical to $V_{H\_clamp}$. In other embodiments, $V_{M\_clamp}$ may be higher than $V_{H\_clamp}$ because of a voltage drop across a series resistance between the two components. In various embodiments, the DUP ESD component is able to dissipate a current $I_{H\_failure}$ before failure that is much smaller than the current $I_{M\_failure}$ dissipated by the main ESD component before failure. Failure may include damage or destruction of the respective protection component. A voltage drop may be provided by a series resistance between the main ESD component and the DUP that prevents the voltage of an entire ESD or surge event from being applied to the DUP and, along with the main ESD component, prevents damage to the DUP. Such a voltage drop is provided, for example, by resistor 108 as described in reference to FIG. 1b.

Further, the current ratio $I_{MAIN}$:$I_{HBM}$ may be at least 3:1 or greater in various embodiments. In various embodiments, the slope of $I_{MAIN}$ indicates dynamic resistance $R_{dyn\_MAIN}$ of the main ESD component and the slope of $I_{HBM}$ indicates the dynamic resistance $R_{dyn\_HBM}$. A lower dynamic resistance may allow more discharge current to be dissipated. Thus, the main ESD component is able to dissipate a much larger current compared to the DUP ESD component, which may be designed only for HBM level ESD events. The ratio of the dynamic resistances $R_{dyn\_HBM}$:$R_{dyn\_MAIN}$ may be at least 2 (i.e., 2:1). In some embodiments, the ratio $R_{dyn\_HBM}$:$R_{dyn\_MAIN}$ is between 5 and 20. In a particular embodiment, the ratio $R_{dyn\_HBM}$:$R_{dyn\_MAIN}$ is 10. For example, $R_{dyn\_HBM}$ may be 2Ω and $R_{dyn\_MAIN}$ may be 0.2Ω. In other embodiments, the ratio $R_{dyn\_HBM}$:$R_{dyn\_MAIN}$ is any value. The combination of the two ESD components may be able to dissipate a large range of voltage transients including ESD and surge events. In various embodiments, the currents and voltages shown in FIG. 8a may be taken with either positive or negative reference and may be switched or inverted by those having skill in the art.

Figure 8B:
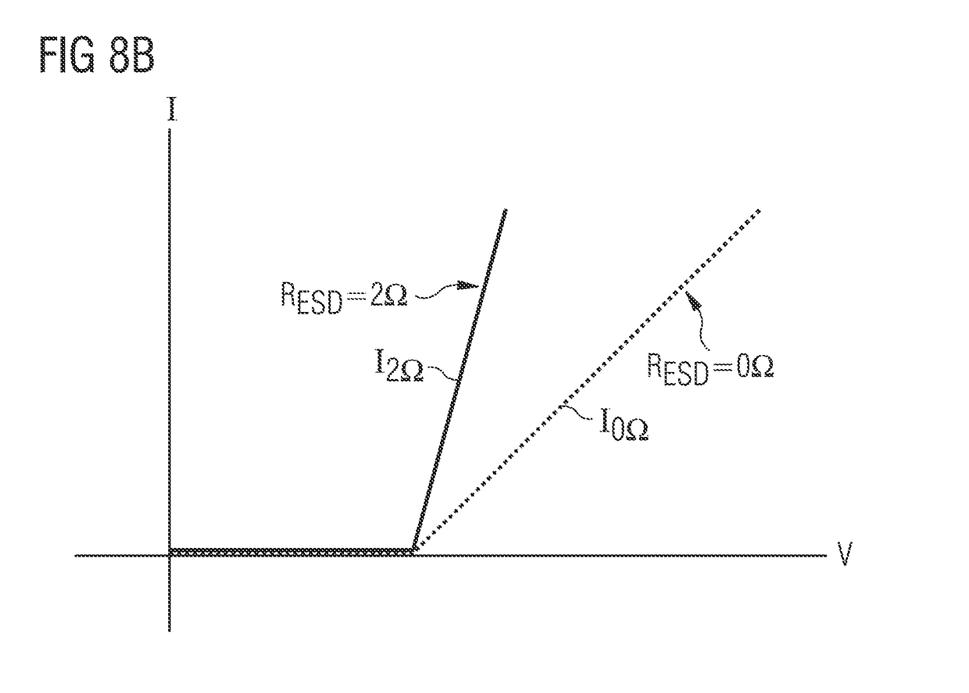

FIG. 8b illustrates I-V plots of an embodiment ESD protection circuit including two values for the series resistance between main ESD component and the DUP ESD component $R_{ESD}$, such as described in reference to resistor 108 in FIG. 1b. In this specific example, series resistance $R_{ESD}$ is set to two values, 2Ω and 0Ω, as shown by curves $I_{2Ω}$ and $I_{0Ω}$, respectively. The vertical axis shows input current, which may correspond to a transient voltage event, and the horizontal axis shows clamping voltage at the output of the embodiment ESD protection circuit. In various embodiments, a series resistance of 2Ω is able to dissipate a larger current as shown by the higher slop of curve $I_{2Ω}$. In other embodiments, other values of series resistance $R_{ESD}$ may be used, as described herein.

The various embodiments described herein are generally described in reference to input nodes, pins, or pads. Such embodiments may be readily applied to output nodes, pins, or pads for any IC or circuit as well.

Particular challenges addressed in various embodiments include line capacitance, clamping voltage, and signal integrity, for example. Line capacitance may be detrimental, especially for high speed signals, because it reduces attainable switching speeds. Generally, ESD protection circuits increase line capacitance because the ESD protection circuit is coupled to the input or output path. Line capacitance of ESD protection circuits is minimized according to embodiment single stage ESD protection circuits disclosed herein due to the elimination of further ESD stages.

Embodiment ESD protection circuits are enabled to provide a current path to ground in order to prevent damage to a protected IC when a voltage at a protected node reaches a set voltage, known as the clamping voltage, during an ESD event. Often, a protected IC, known as a device under protection (DUP), may be damaged even if exposed to the clamping voltage at the protected node. Thus, embodiment ESD protection circuits protect ICs during ESD events where the ESD clamping voltage provided by the implemented single stage ESD protection component is greater in magnitude than the voltage at which the IC would be damaged.

Line impedance may decrease signal integrity (SI). According to various embodiments, line impedance is minimized with a single stage ESD protection circuit as compared to conventional multistage ESD protection circuits. In particular, the resistance is minimized while the overall protection may be improved.

Advantages of various embodiments described herein may include a single stage ESD protection circuit with reduced line capacitance, increased signal integrity, reduced semiconductor area usage, and increased ESD protection.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A transient voltage protection circuit comprising:
   a first integrated circuit comprising:
      an input node;
      an output node;

a first transient voltage protection component coupled between the input node and a reference voltage node, wherein the first transient voltage protection component comprises a first dynamic resistance; and an impedance element coupled between the input node and the output node, wherein the output node is configured to be coupled to a single-stage electrostatic discharge (ESD) protection component having a second dynamic resistance greater than the first dynamic resistance, wherein a trigger voltage of the ESD protection component is the same as a trigger voltage of the first transient voltage protection component.

2. The transient voltage protection circuit of claim 1, further comprising the ESD protection component.

3. The transient voltage protection circuit of claim 1, further comprising a second integrated circuit coupled to the output node of the first integrated circuit, wherein the second integrated circuit comprises a device under protection (DUP) comprising the ESD protection component.

4. The transient voltage protection circuit of claim 1, further comprising:
   the ESD protection component having an input node and an output node, wherein the input node of the ESD protection component is coupled to the output node of the first integrated circuit; and
   a second integrated circuit coupled to the output node of the ESD protection component, wherein the second integrated circuit comprises a device under protection (DUP).

5. The transient voltage protection circuit of claim 1, wherein the first transient voltage protection component comprises a transient voltage suppression (TVS) diode.

6. The transient voltage protection circuit of claim 1, wherein the impedance element comprises a resistive element.

7. The transient voltage protection circuit of claim 6, wherein the resistive element has a resistance less than 10 Ohms and greater than 0.1 Ohms.

8. The transient voltage protection circuit of claim 1, wherein a ratio of the second dynamic resistance to the first dynamic resistance is between 5 and 20.

9. The transient voltage protection circuit of claim 1, wherein the first transient voltage protection component is configured to discharge an ESD voltage up to 30 kV and the ESD protection component is configured to discharge an ESD voltage up to only 3 kV.

10. The transient voltage protection circuit of claim 1, wherein the first transient voltage protection component is configured to discharge an ESD voltage according to system level ESD specification IEC61000-4-2 and the ESD protection component is configured to discharge an ESD voltage according to HBM level specification ANSI/ESDA/JEDEC JS-001.

11. The transient voltage protection circuit of claim 1, wherein the first transient voltage protection component is configured to discharge a larger ESD current than the ESD protection component.

12. The transient voltage protection circuit of claim 1, wherein the reference voltage node is a ground potential node.

13. The transient voltage protection circuit of claim 1, wherein the transient voltage protection circuit is an ESD protection circuit.

14. The transient voltage protection circuit of claim 1, wherein the first transient voltage component comprises a Zener diode.

15. The transient voltage protection circuit of claim 1, wherein the first transient voltage component comprises a first Zener diode and a second Zener diode connected in series between the input node and the reference voltage node, wherein cathodes of the first and second Zener diodes are coupled together.

16. The transient voltage protection circuit of claim 1, wherein the first transient voltage component comprises:
   a first discharge path coupled between the input node and the reference voltage node, the first discharge path comprising a first diode; and
   a second discharge path coupled in parallel with the first discharge path, the second discharge path comprising:
      a second diode coupled with an opposite polarity of the first diode, and
      a Zener diode, wherein cathodes of the Zener diode and the second diode are coupled together.

17. The transient voltage protection circuit of claim 1, wherein the first transient voltage component comprises a thyristor.

18. The transient voltage protection circuit of claim 1, wherein a trigger voltage of the first transient voltage protection component is within 1 volt of a trigger voltage of the ESD protection component.

19. The transient voltage protection circuit of claim 1, wherein the first integrated circuit comprises:
   a plurality of input nodes;
   a first plurality of transient voltage protection components coupled between the plurality of input nodes and a plurality of reference voltage nodes, wherein the first plurality of transient voltage protection components comprises first dynamic resistances;
   a plurality of output nodes configured to be coupled to a plurality of ESD protection components having second dynamic resistances greater than the first dynamic resistances; and
   a plurality of impedance elements coupled between the plurality of input nodes and the plurality of output nodes.

20. A method of protecting a circuit from a transient voltage, the method comprising:
   providing a transient voltage protection circuit comprising an input node and an output node, wherein the transient voltage protection circuit is a single-stage ESD protection circuit;
   receiving a transient peak current at the input node;
   conducting a major portion of the transient peak current to ground through a transient protection diode coupled to the input node; and
   conducting a minor portion of the transient peak current through a resistive element coupled between the input node and the output node, wherein the output node is configured to be coupled to a device under protection (DUP) having a further transient voltage protection circuit, wherein a dynamic resistance of the transient protection diode is less than a dynamic resistance of the further transient voltage protection circuit, and wherein a trigger voltage of the transient protection diode is the same as a trigger voltage of the further transient voltage protection circuit.

21. The method of claim 20, wherein the transient protection diode comprises a Zener diode.

22. The method of claim 20, wherein the transient protection diode comprises a first Zener diode and a second Zener diode connected in series between the input node and a reference voltage node, wherein cathodes of the first and second Zener diodes are coupled together.

23. The method of claim 20, wherein the transient protection diode comprises:
- a first discharge path coupled between the input node and a reference voltage node, the first discharge path comprising a first diode; and
- a second discharge path coupled in parallel with the first discharge path, the second discharge path comprising:
  - a second diode coupled with an opposite polarity of the first diode, and
  - a Zener diode, wherein cathodes of the Zener diode and the second diode are coupled together.

24. A method of protecting a circuit from a transient voltage, the method comprising:
- receiving a transient peak current at a transient voltage protection circuit coupled between an input node and an output node, wherein the transient voltage protection circuit is a single-stage ESD protection circuit;
- generating a first voltage drop across a transient voltage protection diode based on the received transient peak current;
- generating a second voltage drop across a resistive element based on the received transient peak current, wherein the resistive element is coupled between the input node and the output node; and
- wherein the output node is configured to be coupled to a device under protection (DUP) having a secondary transient voltage protection diode, wherein a dynamic resistance of the transient voltage protection diode is less than a dynamic resistance of the secondary transient voltage protection diode, and wherein a trigger voltage of the transient voltage protection diode is the same as a trigger voltage of the secondary transient voltage protection diode.

25. The method of claim 24, further comprising generating a third voltage drop across the secondary transient voltage protection diode based on the received transient peak current.

26. A semiconductor device comprising:
- a first contact pad disposed over a semiconductor substrate;
- a first transient voltage protection device comprising a first dynamic resistance, the first transient voltage protection device being disposed in or over a semiconductor substrate and coupled to the first contact pad, wherein the first transient voltage protection device is a single-stage electrostatic discharge (ESD) protection circuit;
- a resistive layer disposed in or over the semiconductor substrate; and
- a second contact pad disposed over the semiconductor substrate, the resistive layer being coupled to the second contact pad, wherein the second contact pad is configured to be coupled to a second transient voltage protection device having a second dynamic resistance greater than the first dynamic resistance, and wherein a trigger voltage of the ESD protection component is the same as a trigger voltage of the first transient voltage protection device.

* * * * *